United States Patent
Brown et al.

(10) Patent No.: US 6,297,063 B1
(45) Date of Patent: Oct. 2, 2001

(54) IN-SITU NANO-INTERCONNECTED CIRCUIT DEVICES AND METHOD FOR MAKING THE SAME

(75) Inventors: Walter L. Brown, Berkeley Heights; Sungho Jin, Millington; Wei Zhu, Warren, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/426,453

(22) Filed: Oct. 25, 1999

(51) Int. Cl.⁷ ................................................ H01L 21/00
(52) U.S. Cl. ............................... 438/2; 438/618; 438/962
(58) Field of Search .................................. 438/2, 618, 962

(56) References Cited

PUBLICATIONS

Nassiopoulou, A. G.; "Low Dimensional Silicon for Integrated Optoelectronics"; Semiconductor Conference, 1998; Oct. 6–10, 1998; pp. 417–426.*

Fujita et al. "A Micromachined Tunneling Current Device for the Direct Observation of the Tunneling Gap"; Emerging Technologies and Factory Automation, 1999; Oct. 18–21, 1999; pp. 367–372.*

Fan et al., "Self–Oriented Regular Arrays of Carbon Nanotubes and Their Field Emission Properties", Jan. 22, 1999, vol. 283 Science, pp. 512–514.

Kong et al., "Synthesis of Individual Single–Walled Carbon Nanotubes on Patterned Silicon Wafers", vol. 395, Oct. 29, 1998, pp. 878–881.

Li et al., "Large–Scale Synthesis of Aligned Carbon Nanotubes", vol. 274, Dec. 6, 1996, pp. 1701–1703.

Ren et al., "Synthesis of Large Arrays of Well–Aligned Carbon Nanotubes on Glass", vol. 282, Nov. 6, 1998, Science, pp. 1105–1107.

* cited by examiner

*Primary Examiner*—Long Pham
*Assistant Examiner*—Fernando Toledo
(74) *Attorney, Agent, or Firm*—Lowenstein Sandler PC

(57) ABSTRACT

A circuit device is disclosed comprising at least two circuit layers interconnected with a plurality of substantially equi-length nanowires disposed therebetween. The nanowires may comprise composites, e.g., having a heterojunction present along the length thereof, to provide for a variety of device applications. Also disclosed is a method for making the circuit device comprising growing a plurality of nanowires in-situ on at least one circuit substrate and then interconnecting the nanowires to a mating substrate.

19 Claims, 6 Drawing Sheets

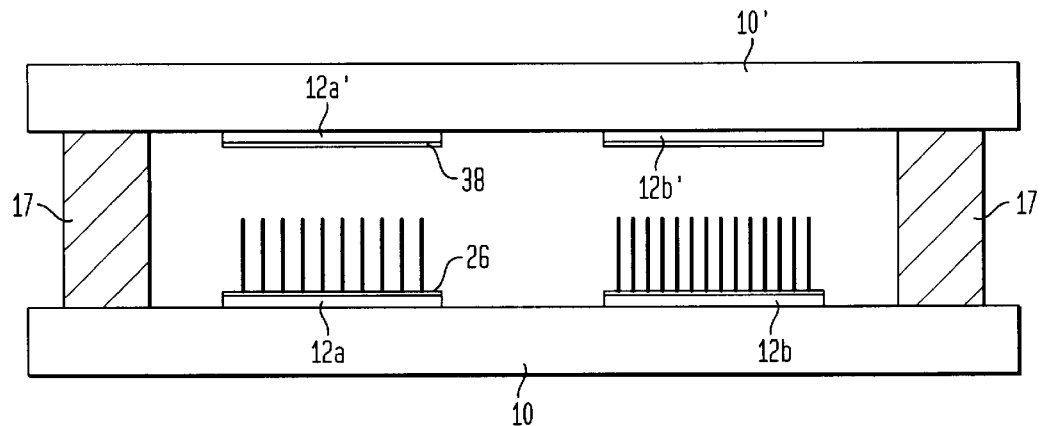
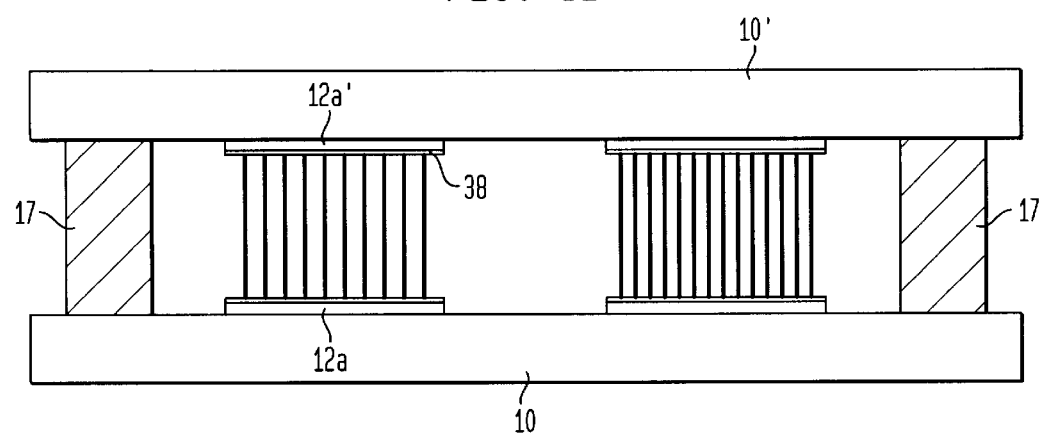

IN-SITU NANO-INTERCONNECTED CIRCUIT DEVICES AND METHOD FOR MAKING THE SAME

RELATED APPLICATIONS

This application is related to U.S. patent application Ser. No. 09/405,691, titled "Tactile Sensor Comprising Nanawires and Methodfor Making the Same," filed Sep. 24, 1999, by inventor Jin herein, and U.S. Pat. application Ser. No. 09/420,157, titled "Article Comprising Vertically Nano-Interconnected Circuit Devices and Method for Making the Same," filed concomitantly herewith, by inventors Brown, Jin and Zhu herein, both of which are assigned to the present assignee and incorporated herein by reference.

FIELD OF THE INVENTION

This invention relates to structures for nano-interconnected circuits and methods of making same, and more particularly, to structures interconnected with conductive nanowires and methods for making the interconnections in-situ.

BACKGROUND OF THE INVENTION

Nano-scale wires such as carbon nanotubes with a very small size scale, on the order of 1–100 nanometers in diameter and 0.1–100 μm in length, have received considerable attention in recent years. See Liu et al., SCIENCE, Vol. 280, p. 1253 (1998); Ren et al., SCIENCE, Vol. 282, p. 1105 (1998); Li et al., SCIENCE, Vol. 274, p. 1701 (1996); Frank etal., SCIENCE, Vol. 280, p. 1744 (1998); J. Tans et al., NATURE, Vol. 36, p. 474 (1997); Fan et al., SCIENCE, Vol. 283, p. 512 (1999); Collins et al., SCIENCE, Vol. 278, p. 100 (1997); Kong et al., NATURE, Vol. 395, p. 878 (1998); and Ebbesen et al., NATURE, Vol. 382, p. 54 (1996).

Carbon nanotubes exhibit unique atomic arrangements, nano-scale structures and interesting physical properties such as one-dimensional electrical behavior, quantum conductance, and ballistic transport characteristics. The ballistic transport in carbon nanotubes, as reported by Frank et al, allows the passage of huge electrical currents in electronic circuits, with the magnitude of current density comparable to or better than those in some superconductors. Carbon nanotubes are one of the smallest dimensioned nanowire materials with generally high aspect ratio. They may have a small diameter of ~1 nm in the case of single-wall nanotubes and less than ~50 nm in the case of multi-wall nanotubes. See Rinzier et al, APPLIED PHYSICS, Vol. A67, p. 29 (1998); Kiang et al, J. PHYSICAL CHEM., Vol. 98, p. 6612 (1994), and Kiang et al, PHYSICAL REVIEW LETTERS, Vol, 81, p. 1869 (1998).

High-quality single-walled carbon nanotubes are typically grown as randomly oriented, needle-like or spaghetti-like, tangled nanotubes by laser ablation or arc techniques (a chemical purification process is usually needed for arc-generated carbon nanotubes to remove non-nanotube materials such as graphitic or amorphous phase, catalyst metals, etc.). Chemical vapor deposition (CVD) methods such as used by Ren et al., Fan et al., and Li et al tend to produce multiwall nanotubes attached to a substrate, often with a semi-aligned or an aligned, parallel growth perpendicular to the substrate. As described in these artides, catalytic decomposition of hydrocarbon-containing precursors such as ethylene, methane, or benzene produces carbon nanotubes when the reaction parameters such as temperature, time, precursor concentration, flow rate, are optimized. Nucleation layers such as a thin coating of Ni, Co, Fe, etc. are often intentionally added to the substrate surface to nucleate a multiplicity of isolated nanotubes. Carbon nanotubes can also be nucleated and grown on a substrate without using such a metal nucleating layer, e.g., by using a hydrocarbon-containing precursor mixed with a chemical component (such as ferrocene) which contains one or more of these catalytic metal atoms. During the chemical vapor decomposition, these metal atoms serve to nucleate the nanotubes on the substrate surface. See Cheng et al., CHEM. PHYSICS LETTERS, Vol. 289, p. 602 (1998).

The modern trend in electronic circuit design, interconnection and packaging is toward use of finer features, such that submicron feature sizes have been reached in recent years. To produce desired, ultra-high density electronic packaging, a small width of the circuit lines is important, as well as a three-dimensional, multi-layer configuration with vertically-integrated circuit layers. However, nanowires grown with presently-available methods are not suitable for such purposes. The as-grown single-wall nanotubes (SWNT) such as commonly synthesized by laser ablation or arc method, have a spaghetti-like configuration and often are tangled with each other. The multi-wall nanotubes (MWNT), such as commonly made by chemical vapor deposition, are easier to prepare in an aligned and parallel configuration. However, these as-grown nanotubes such as reported by Ren et al. and Li, et al. differ in height or length. For reliable circuit interconnections without electrical shorts or opens, it is desirable to prepare nanowires having equal and specific predetermined lengths. Co-pending application titled "Article Comprising Vertically Nano-Interconnected Circuit Devices and Methodfor Making the Same," filed concomitantly herewith by inventors Brown, Choi and Jin herein, discloses fabrication approaches for equalizing the length of nanowires and bonding them to circuit substrates for interconnections. However, it also would be advantageous to provide a method for growing the nanowires in-situ between circuit pads or components thereby avoiding equalization and soldering operations.

SUMMARY OF THE INVENTION

The invention comprises a nano-interconnected circuit device having at least two circuit layers or circuit devices which are placed either in a parallel configuration or in a side-by-side configuration, and a plurality of substantially equi-length nanowires disposed therebetween. Also disclosed is a method of making the devices comprising in-situ growth of the nanowires on at least one of the circuit substrates of the interconnected device. The method of in situ growth comprises providing at least a first and a second circuit substrate; aligning the circuit substrates in a spaced-apart substantially parallel relation to define a gap therebetween; depositing a catalytic nucleation layer on at least one of the circuit substrates; and growing a plurality of nanowires from the catalytic nucleation layer so that the plurality of nanowires are disposed between the first and second substrates. The as-grown nanowires are connected to provide the interconnected circuit device. In one embodiment, the nanowires are grown from both the first and second substrates and are connected by being merged as they grow together. In another embodiment, the nanowires are grown from one of the circuit substrates and then solder bonded to the other circuit substrate. In yet another embodiment, the nanowires are grown so that adjacent nanowires will overlap when the first and second circuit substrates are aligned, and then the adjacent nanowires are interconnected with Van der Waals attraction bonding and optional further electrical connections. With this invention, vertical or horizontal interconnections can be achieved.

BRIEF DESCRIPTION OF THE DRAWINGS

For a better understanding of the invention, an exemplary embodiment is described below, considered together with the accompanying drawings, in which:

FIGS. 3A–3B schematically illustrate an alternative exemplary process for in-situ growth of nanowires between two circuit substrates;

It is to be understood that these drawings are for the purposes of illustrating the concepts of the invention and are not to scale. Like reference numerals are used in the Figures to refer to like features.

DETAILED DESCRIPTION OF THE INVENTION

Applicants have discovered methods for preparing electrically-conducting nanowires such as carbon nanotubes that are useful as nano-scale, connecting wires between circuit device layers. The methods described herein comprise in-situ growth of the nanowires on one or more circuit substrates and interconnections. For circuit interconnections, such as between two circuit layers or mating devices, the use of many, sub-divided parallel conductive paths can be achieved with aligned nanowires. The nanowires provide elastic compliance and flexibility of the interconnection medium which are advantageous in avoiding short and long-term reliability problems, e.g., caused by undesirable stresses. Common sources of stresses exerted on the interconnection medium include local temperature gradients, stresses arising from mismatches of the thermal expansion coefficients between different materials used in the devices, electromigration-induced stresses, and mechanical and thermal stresses introduced during device assembly, handling, testing, or shipping. The invention avoids the reliability problems caused by such stresses including fatigue, creep, or deformation failures of the interconnection medium or circuit components.

Nanowires can be synthesized by a variety of known methods, such as laser ablation, arc discharge, or chemical vapor deposition of a precursor gas or mixture of precursor gases. Reference is made to co-pending U.S. Pat. applications Ser. No. 09/236,966, filed Jan. 25, 1999, titled "Article Comprising Enhanced Nanotube Emitter Structure and Process for Fabricating Article, Serial No. 09/405,691, titled "Tactile Sensor Comprising Nanowires and Methodfor Making the Same," filed Sep. 24, 1999 by inventor Jin herein, and Ser. No. 09/420,157, titled "Article Comprising Vertically Nano-Interconnected Circuit Devices and Method for Making the Same," filed concomitantly herewith by inventors Brown, Jin, and Zhu, which are each assigned to the present assignee and incorporated herein by reference. These applications disclose methods for fabricating nanowires and bonding techniques for making vertical interconnections. With the methods described herein, the nanowires are grown in-situ on the circuit substrate and interconnected. Thus, the equalization and solder bonding processes as disclosed in the co-pending Brown, Jin and Zhu application cited above may be avoided.

Figure 1A:
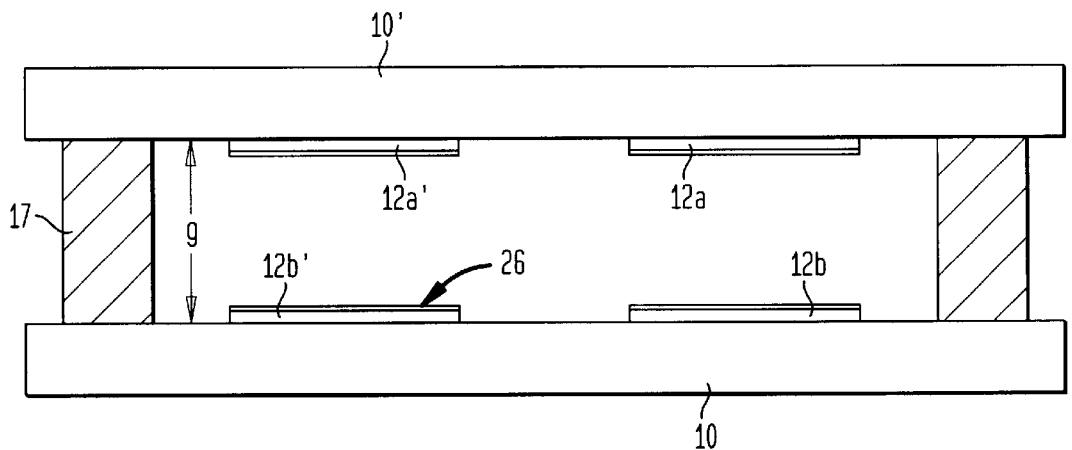
FIGS. 1A–1C schematically illustrate an exemplary process for in-situ growth of nanowires between two circuit substrates.
Figure 1B:
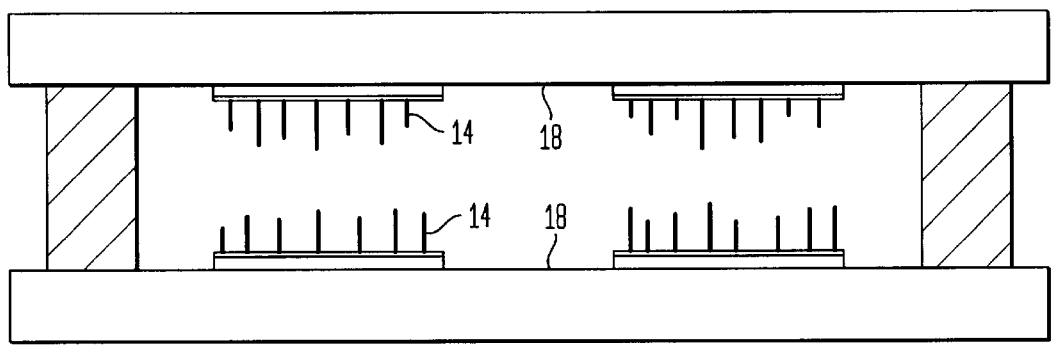
Figure 1C:
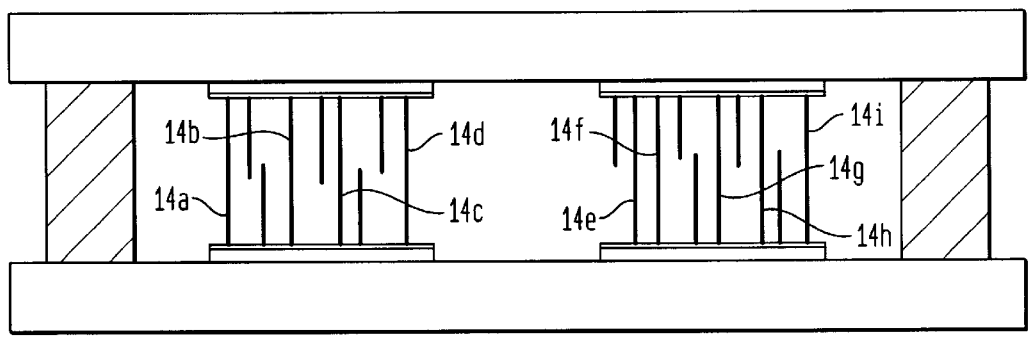

Referring to the figures, FIGS. 1A–1C schematically illustrate an exemplary process for in-situ growth of nanowires between two circuit substrates. In FIG. 1A, two mating circuit substrates 10, 10', having electrical contact pads thereon 12a, 12b, 12a' and 12b', are arranged such that the contact pads face each other. The relative positions of the corresponding contact pads (e.g., 12a, 12a' and 12b, 12b') are aligned, and the substrates are held in a fixed position to maintain the pad alignment and a desired inter-pad spacing. In FIGS. 1A–1C, two circuit layers are positioned facing each other. However, it should be understood that additional layers may be stacked as well, if desired, to achieve a multilayer stacked configuration, e.g., for higher-density, three-dimensional circuit constructions.

Preferably, a catalytic nucleation layer 26 is selectively disposed on the surface of each contact pad, not in the areas between adjacent pads, so that nanowires will be selectively grown on the pad surfaces. The catalytic nucleation layer typically comprises a thin film of catalyst material, e.g., having a thickness of about 1–500 nm, and more preferably in the range of 2–50 nm. The nucleation layer may be deposited by deposition methods known in the field such as sputtering, evaporation, CVD, and electrochemical deposition. Exemplary catalytic materials for forming the nucleation layer include Ni, Co, Fe, or alloys of these materials. The catalytic material should be electrically conductive for use in enabling the circuit interconnections, e.g., it may comprise metals, alloys, carbides, nitrides, or silicides.

The material used for making the contact pads 12a, 12b, 12a', 12b', can be selected from those commonly used in semiconductor circuit fabrication, e.g., Al, Cu, W, Ta or $CoSi_2$. The selected pad material should be stable at the processing temperature for CVD, which typically is in the range of 400–1000° C. Alternatively, the contact pads can be fabricated carbides or nitrides, as referenced above, in which case the carbides or nitrides can serve as metalallization, diffusion barrier, and in some cases as catalyst materials. Typically, the circuit substrates are fabricated from semiconductor materials, such as Si, Ge, and GaAs, with the contact pads being lithographically patterned thereon after thin film deposition. The contact pads 12a, 12b, etc., typically are less than 25 microns square in area, preferably less than 1 micron square, and even more preferably less than 0.01 microns square. The shape of the pads is not important, e.g., they may be square, rectangular, circular, or take other shapes. They also may comprise a matrix of contact positions formed with intersecting parallel conductive strips. In FIG. 1A, the desired gap "g" between the mating circuit substrates 10, 10', is typically in the range of 0.01 to 500 microns, preferably 0.1 to 100 microns, and even more preferably 0.2 to 10 microns. A spacer 17 can be used to maintain the gap, which may be comprised of a film deposited on one or both of the substrates 10, 10' or a ceramic or polymeric adhesive layer placed between them.

Once the mating substrates 10, 10' are properly aligned, as in FIG. 1A, the nanowires can be nucleated and grown toward each other. FIG. 1B, for example, shows two nanowires 14, 14 growing toward each other. When the catalytic nucleation layer is deposited on only the contact pads, the nanowires will grow only from the pad areas, as shown, not on the inter-pad surfaces 18. Advantageously, the nanowires will grow perpendicular to the pad surfaces. Preferably the deviation from complete vertical (perpendicular) alignment is insubstantial, that is, it is less than about 25 degrees and preferably less than 15 degrees from fill (90°) alignment. An external electric field nay be applied to promote a parallel, aligned growth, perpendicular to the pad surfaces. The strength of the applied field will depend on the nature of the nanowire materials and their desired dimensions (e.g., diameter, mechanical stiffness, and electrical properties), but typically the field will be in the range of about 0.01 to 1000 volts/micron, preferably 1–200 volts/micron.

As the CVD processing continues, nanowires growing from the upper and lower mating circuit substrates meet. In the presence of a sufficient electric field and depending on the growth mechanisms involved, e.g., a "base-growth mechanism" or a "tip-growth mechanism" (see S. Amelinckx el al., SCIENCE Vol. 265 (1994), at p. 635 and articles by Fan and Li, cited supra), pairs of nanowires in close proximity could merge into single nanowires 14a, 14b, 14c. . . 14i, as illustrated in FIG. 1C. In-situ vertical interconnections are thus realized. It is not necessary that all or substantially all of the nanowires merge, only that a sufficient number of nanowires merge to effect the vertical interconnection.

Figure 2:
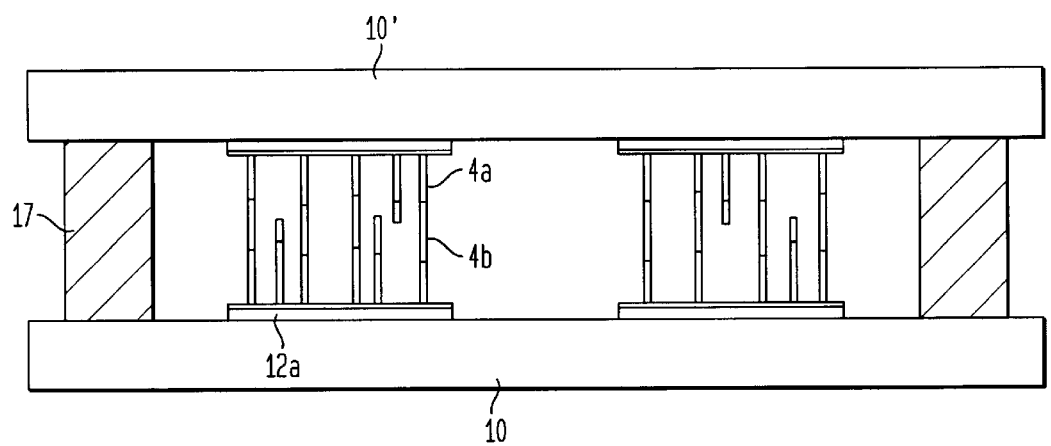
FIG. 2 schematically illustrates an in-situ vertically interconnected device having nanowires with heterojunctions.

The inventive method for in-situ growth and interconnection of nanowires also may be applied to nanowires possessing unique device characteristics, which is illustrated in FIG. 2. Linearly-cnnected metal-semiconductor wires may be used. For example, FIG. 2 shows metallic carbon nanotubes 4a attached to the ends of semiconductor nanowires 4b. See also J. Hu et al., NATURE Vol. 399 (1999), at p. 48. The metal-semiconductor heterojunction can be integrated into one or more of the nanowires to serve as a rectifying diode device. Other types of devices such as p-n junctions, transistor structures, or tunneling device structures also may be incorporated into the nanowires. With the instant growth and merge technique, an array of metal-semiconductor-metal or semiconductor-metal-semiconductor junctions can be achieved. If the nanotube growth is based on the tip-growth mechanism, catalyst metal particles may be required at the advancing nanotube tips, as is the case under certain CVD synthesis conditions. In this case, two merging nanotubes may swallow the catalyst particles in their inner cavities, or eject them sideways and continue to grow and merge, or the catalyst particles may meet and form a metal-metal bonding (a Van der Waals attraction bonding or, at a sufficiently high CVD temperature, a diffusion bonding). If the catalyst particles are swallowed or partially ejected, the nanowire atomic arrangement may be disturbed at such locations, and this itself can induce a semiconductor region or a heterojunction due to the locally stressed or bent regions.

FIGS. 3A–3B illustrate an alternative exemplary process for in-situ growth and vertical interconnection. Here, two circuit substrates 10, 10' are provided and aligned as above, and spacers 17 may be used to maintain the alignment. The nanowires are grown on the contact pads 12a, 12b of one of the circuit substrates 10, which are coated with a catalytic nucleation layer 26, whereas the contact pads 12a', 12b' of the other circuit substrate 10' are coated with solder material 38. The solder materials may be selected from Au-Sn, Sn-Ag, Sn-Sb, Pb-Sn, Bi-Sn, In-Sn, In-Ag eutectic solders or other solders known in the field. If the nanowire synthesis calls for high temperature processing, e.g., CVD at ~500°, the solder layer material should be selected from higher melting point alloys such as hard solders or brazing alloys well known in the art. In the case of carbon nanotubes or nitride-type nanowires/nanotubes, the solder materials also may be alloyed with a small amount (e.g., 0.1 to 5 weight percent) of one or more carbide- or nitride-forming elements, such as Ti, Mo, Cr, Nb, V, Fe, W, Zr, and Ta, to improve the wetting of nanowires with the solder material 38. Here, the nanowires nucleate and grow from one of the two substrates 10 (FIG. 3A), and eventually the nanowires achieve a sufficient length to contact the solder material 38 (FIG. 3B). Once the contact has been made (e.g., FIG. 3B), the structure may be heated to solder bond the nanowire tips to the solder layer 38 and complete the vertical integration.

Figure 4A:
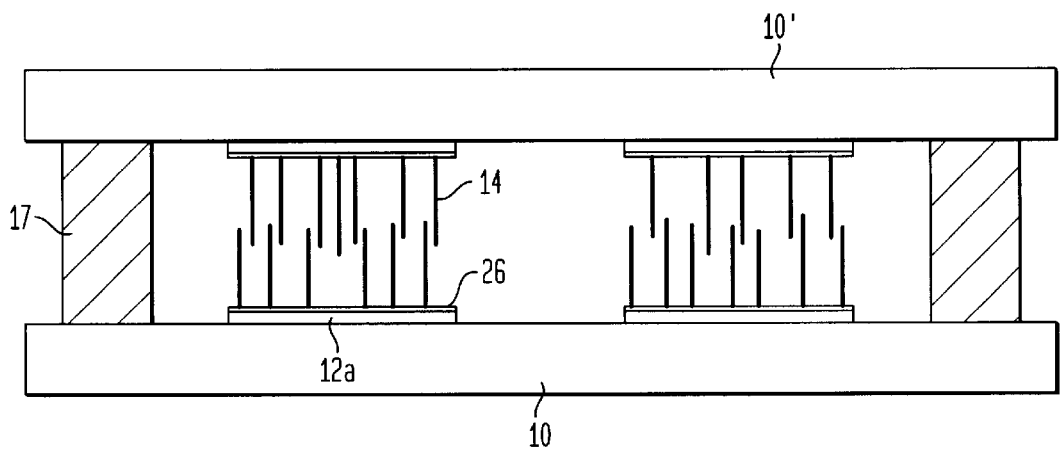
FIGS. 4A–4C schematically illustrate an alternative exemplary process for in-situ growth of nanowires between circuit substrates.
Figure 4B:
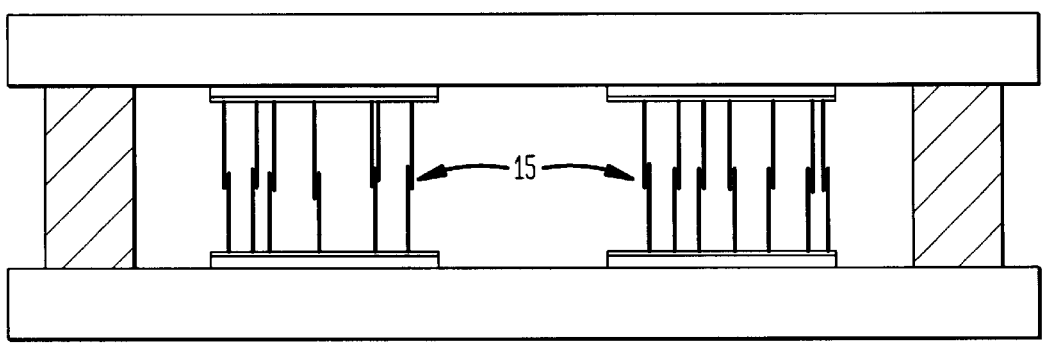
Figure 4C:
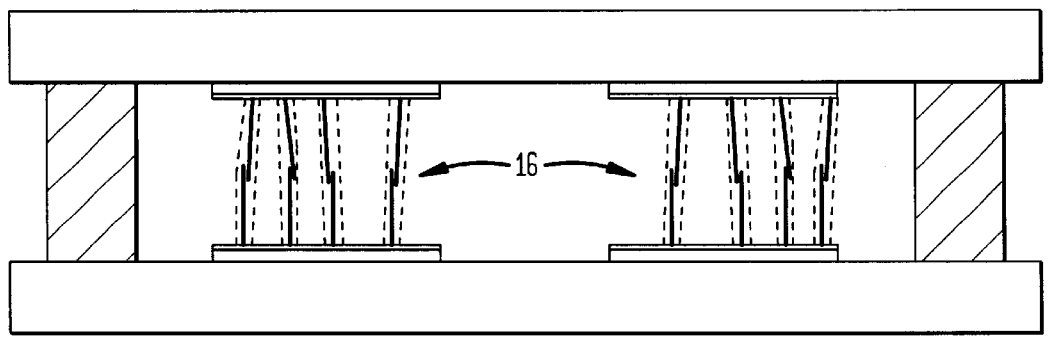

FIGS. 4A–AC illustrate an alternative exemplary process for in-situ growth and vertical interconnection, performed by removing the applied electric field before the nanotubes growing and approaching each other from opposite directions come in close proximity to each other. In the absence of the electric field, the approaching nanowires from opposite circuit substrates 10, 10' are much less likely to merge and thus, the structure of FIG. 4A is achieved, e.g., with nanowires passing each other. Van der Waals attractive bonding 15 may occur, as illustrated in FIG. 4B, so the nanowires contact each other, either naturally or by stimulating physical contacts between neighboring nanowires, particularly with single-walled nanowires or thin multi-walled nanowires. Physical contact may be stimulated through application of an air flow or another technique for mechanically vibrating the nanowires. The parallel attachment of the nanowires by Van der Waals bonding is especially advantageous for reliability when undesirably large stresses or strains, such as might be caused by substantial thermal expansion mismatch of dissimilar circuit or substrate materials, are inadvertently introduced. Under such circumstances, the attached wires can simply slide against each other maintaining the electrical contact, yet accommodating the large strain without fracturing the nanowires. The Van der Waals bonding may itself be sufficient to achieve the desired vertical interconnection; however, if further electrical interconnection and lower resistance is desired, further enhanced bonding of the nanowires may be carried out, trading off some of the stress-accommodating ability of the parallel-attached configuration of FIG. 4B. For example, conductive metals 16 may be deposited on at least a portion of the wires, as illustrated in FIG. 4C, e.g., with CVD metal deposition or electrochemical deposition.

Figure 5A:
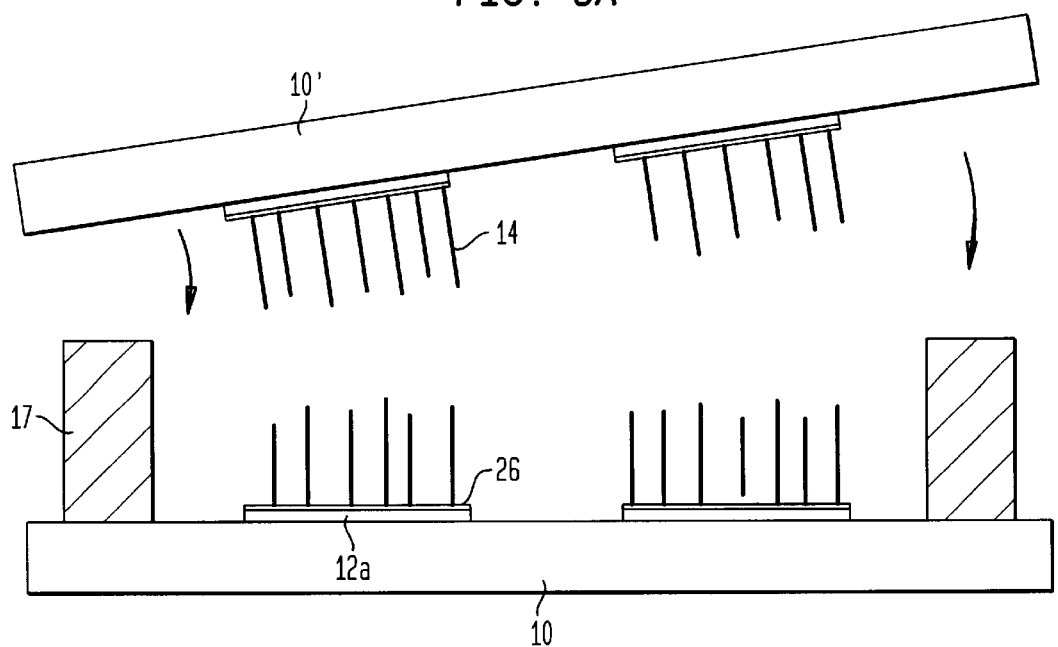
FIGS. 5A–5B schematically illustrate an exemplary process comprising growth of nanowires on mating circuit substrates and connecting the mating substrates.
Figure 5B:
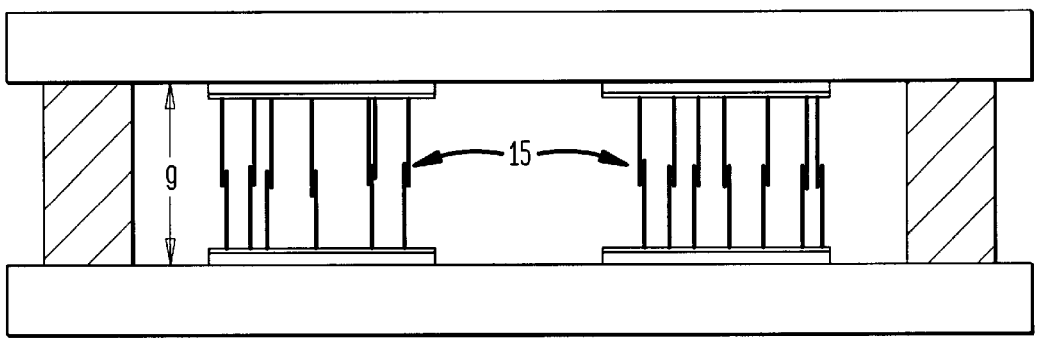

Alternatively, the nanowires may be first grown separately on two mating circuit substrates 10, 10', and then the circuits aligned, positioned facing each other, and then brought close to each other, as shown in FIG. 5A. Advantageously, the nanowires are grown in a substantially perpendicular and parallel, aligned manner, and the length of the nanowires on each substrate is preferably greater than fifty-percent of the gap (g) (FIG. 5B), such that when the substrates are placed together, e.g., as per FIG. SA, the combined lengths of the nanowires will be longer than the gap. In this way, Van der Waals attraction and bonding 15 will occur between adjacent nanowires, as shown in FIG. SB, especially when the nanowires have small diameter (e.g., less than ~10nm), enabling vertical electrical interconnections. Also, if further electrical interconnection and lower resistance is desired, the nanowires may be further bonded as described above with reference to FIG. 4C. If the length of the nanowires on each substrate is less than fifty-percent of the gap (g), such that the nanowires on each substrate 10, 10' do not meet, these nanowires may be further grown, e.g., using CVD growth in the presence of an applied electrical field, so that they grow and merge into single nanowires, such as shown in FIG. 4A.

Figure 6A:
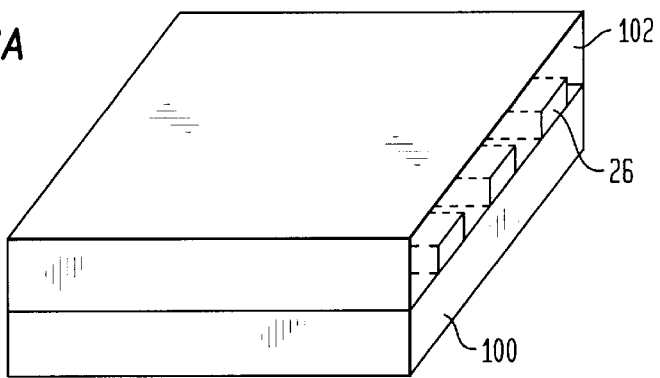
FIGS. 6A–6C schematically illustrate an exemplary process for in-situ growth of nano-wires to fabricate horizontally-interconnected circuit devices.
Figure 6B:
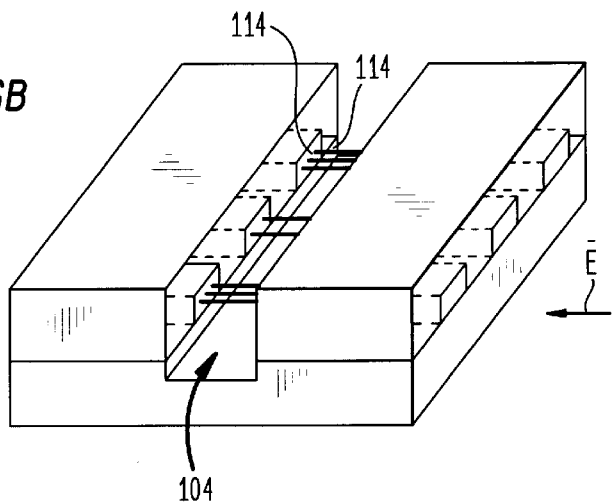
Figure 6C:
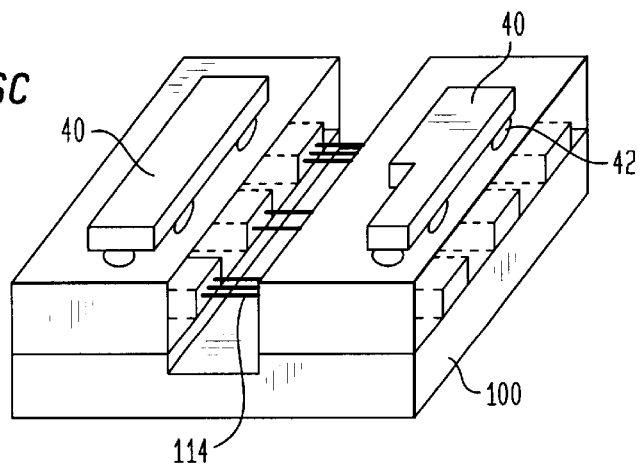

The in-situ growth and interconnection technique of this invention also may be applied to effect horizontal circuit interconnections. An exemplary method for making such interconnections is shown in FIGS. 6A–6C. First, in FIG. 6A a substrate 100 is provided which may comprise a semiconductor wafer, e.g., comprised of Si, $SiO_2$, $SiN_4$, or other materials known in the field for fabricating semiconductor wafers. The substrate may contain various circuit components such as a source, drain, gate, or devices such as diodes, transistors, and the like. The substrate or the circuits may be coated with a metallization layer, such as a layer of Cu, Al, W, Ta, or $CoSi_2$. As shown in FIG. 6A, a catalytic nucleation layer 26 is applied and patterned if necessary, e.g., using the Fe, Co, Ni, carbide, or nitride materials previously mentioned for this layer. Advantageously, the catalytic nucleation layer is fabricated with a material so that it can also serve as a diffusion barrier material for the semiconductor circuits, e.g., as is the case when a TiN or TaN layer is used. The metlization and catalytic nucleation layers are then lithographically patterned into a desired circuit line and pad configuration and coated with a dielectric (insulating) layer 102 such as $SiO_2$ or $SiN_4$ to provide the structure illustrated in FIG. 6A.

As shown in FIG. 6B, a horizontal slot 104 is then cut into the layer structure of FIG. 6A, e.g., using laser beam or lithography processing. The cross-section of the catalytic nucleation layer is thereby exposed. Nanowires may be nucleated from this exposed surface and allowed to grow horizontally. An electric field $\overline{E}$ may be applied across the slot so that the nanowires 114 grow in an aligned fashion and merge, as shown in FIG. 6B. Device functions such as p-n junctions, tunnel junctions, and rectifiers can thus be introduced in the slot area, depending on the specific design needs. Alternatively, the electric field direction may be altered to promote the growth of the nanowires in different directions to interconnect different slots. The circuit assembly also may be further CVD processed to add interconnections or create interconnections to other slots. As shown in FIG. 6C, additional circuits or devices 40 (e.g., such as a multi-layered demascene structure) may be bonded to the resulting structure, e.g., by flip-chip solder bonding 42.

It is understood that the embodiments described herein are merely exemplary and that a person skilled in the art may make many variations and modifications without departing from the spirit and scope of the invention. All such variations and modifications are intended to be included within the scope of the appended claims.

We claim:

1. A method of making an interconnected circuit device comprising at least a first and a second circuit substrate and a plurality of substantially parallel nanowires disposed between them, the method comprising the steps of
   aligning the at least first and second circuit substrates in a spaced-apart substantially parallel relation to define a gap therebetween;
   depositing a catalytic nucleation layer on at least the first circuit substrate;
   growing the plurality of nanowires from the catalytic nucleation layer on at least the first circuit substrate; and
   connecting the grown nanowires to the second circuit substrate to provide the interconnected circuit device.

2. The method of claim 1 in which the nanowires are grown in a horizontal direction relative to the at least first circuit substrate.

3. The method of claim 2, in which the at least first and second circuit substrates comprise a semiconductor wafer having a slot defined therein.

4. The method of claim 3 further comprising bonding one or more electronic devices to the interconnected circuit device.

5. A method of making an interconnected circuit device comprising at least two circuit substrates, at least one contact pad on each of the at least two circuit substrates to define at least a first and a second contact pad, and a plurality of substantially parallel nanowires disposed between the first and second contact pads to interconnect the two circuit substrates, the method comprising the steps of:
   aligning the two circuit substrates in a spaced-apart substantially parallel orientation to define a gap therebetween having a predetermined size wherein the first contact pad is aligned facing the second contact pad;
   depositing a catalytic nucleation layer on the surface of at least the first contact pad;
   growing the plurality of nanowires from the catalytic nucleation layer of at least the first contact pad; and
   connecting the grown nanowires to one of the second contact pad or nanowires grown thereon to provide the interconnected circuit device.

6. The method of claim 5 in which the step of depositing the catalytic nucleation layer comprises depositing the layer on the first and second contact pads and growing the plurality of nanowires from the catalytic nucleation layers on the surfaces of the first and second contact pads.

7. The method of claim 6, further comprising the step of applying an electric field to promote the growth of the nanowires in an aligned orientation perpendicular to the circuit substrates and in which the step of connecting the nanowires comprises the nanowires merging during growth.

8. The method of claim 5 in which the step of growing the nanowires comprises growing them to a length greater than fifty-percent of the size of the gap and the step of connecting comprises Van der Waals attractive bonding between adjacent nanowires.

9. The method of claim 8, further comprising the step of mechanically stimulating physical contacts between adjacent nanowires.

10. The method of claim 8, further comprising coating the nanowires with conductive metals to enhance interconnections between them.

11. The method of claim 5 in which the at least second contact pad is coated with solder material, the step of growing the nanowires comprises growing the nanowires from the first contact pad, and the step of connecting comprises heating at least the second contact pad so that the nanowires are solder bonded to the second contact pad.

12. The method of claim 5 further comprising application of an electric field to promote growth of the nanowires in an aligned orientation perpendicular to the at least one contact pad surface.

13. The method of claim 5 in which the step of aligning the two circuit substrates comprises disposing a spacer having a predetermined height between the two circuit substrates to maintain them in a fixed spaced-apart relation.

14. The method of claim 5 in which the catalytic nucleation layer is electrically conductive.

15. The method of claim 5 in which the catalytic nucleation layer is fabricated with a material selected from the group consisting of metal alloys, carbides, nitrides and silicides.

16. The method of claim 5 in which the nanowires comprise heterojunctions.

17. The method of claim 5 in which the step of growing is performed before the step of aligning.

18. A method of making an interconnected circuit device comprising:

providing at least two circuit substrates, wherein at least one contact pad is disposed on each of the at least two circuit substrates to define at least a first and a second contact pad, depositing a catalytic nucleation layer on the surfaces of the first and second contact aligning the two circuit substrates in a spaced-apart substantially parallel orientation to define a gap therebetween wherein the first contact pad is aligned facing the second contact pad;

growing a plurality of nanowires from the surfaces of the first and second contact pads with an electric field being applied to promote growth of the nanowires in a direction substantially perpendicular to the contact pads, whereby a plurality of nanowires grown from the first contact pad merge with a plurality of nanowires grown from the second contact pad to thereby provide an interconnected circuit device.

19. The method of claim 18 in which at least three circuit substrates are provided and aligned in a stacked orientation with the plurality of nanowires grown between adjacent circuit substrates to produce a multilayer-stacked configuration.

* * * * *